United States Patent [19]
Gotoh et al.

[11] Patent Number: 5,885,901
[45] Date of Patent: Mar. 23, 1999

[54] RINSING SOLUTION AFTER RESIST STRIPPING PROCESS AND METHOD FOR MANUFACTURING SEMICONDUCTOR DEVICE

[75] Inventors: Hideto Gotoh, Niihari-mura; Masao Miyazaki, Tokyo; Kiyoto Mori, Tsuchiura, all of Japan

[73] Assignee: Texas Instruments Incorporated, Dallas, Tex.

[21] Appl. No.: 773,828

[22] Filed: Dec. 27, 1996

Related U.S. Application Data

[63] Continuation of Ser. No. 662,106, Jun. 14, 1996, abandoned, which is a continuation of Ser. No. 289,046, Aug. 11, 1994, abandoned.

[51] Int. Cl.$^6$ ............................ C09K 13/00; H01L 21/00
[52] U.S. Cl. ...................... 438/720; 438/754; 438/906; 438/745
[58] Field of Search ...................................... 438/720, 754, 438/745, 906; 134/3, 27, 28, 29, 41; 252/79.2, 79.1

[56] References Cited

U.S. PATENT DOCUMENTS

| | | | |
|---|---|---|---|
| 4,087,370 | 5/1978 | Singalewitch et al. | 134/38 X |
| 4,604,144 | 8/1986 | Wong | 134/28 |
| 4,746,397 | 5/1988 | Maeda et al. | 156/662 X |
| 5,007,981 | 4/1991 | Kawasaki et al. | 156/651 X |
| 5,248,384 | 9/1993 | Liu et al. | 156/656 X |
| 5,308,745 | 5/1994 | Schwartzkopf | 430/329 |
| 5,376,235 | 12/1994 | Langley | 156/664 |

*Primary Examiner*—Thi Dang
*Attorney, Agent, or Firm*—William B. Kempler; Richard L. Donaldson

[57] ABSTRACT

After the resist is removed with an alkaline solution, a noncorrosive rinse solution is applied to the substrate which is composed of (a) a water-soluble monovalent lower alcohol and an organic or inorganic acid, or (b) a water-soluble monovalent lower alcohol, an organic or inorganic acid and water or (c) an organic or inorganic acid. This rinse solution prevents corrosion completely when a resist is removed from Al-Si-Cu wiring :material, which is widely used as the wiring material for high-density integrated circuits.

10 Claims, 1 Drawing Sheet

RINSING SOLUTION AFTER RESIST STRIPPING PROCESS AND METHOD FOR MANUFACTURING SEMICONDUCTOR DEVICE

This application is a Continuation of application Ser. No. 08/662,106, filed Jun. 14, 1996, now abandoned, which is a Continuation, of application Ser. No. 08/289,046, filed Aug. 11, 1994, now abandoned.

This invention is related to the rinse solution that is used after the removal of the resist with alkaline solution during the fabrication of the semiconductor device. This rinse solution is considered superior because it does not cause corrosion of such wiring material as Al-Si-Cu frequently used as the wiring material in high-density integrated circuits.

BACKGROUND OF THE INVENTION

During the fabrication of the semiconductor device, after the desired photoresist mask is formed, the wiring pattern is formed by etching. Then the unnecessary resist layer, including the resist layer on top of the wiring pattern, is removed with the resist removal solution and cleaned with a rinse solution. Then it is necessary to use a rinsing process called water washing.

In such cases, as for the solution used to remove the resist, acidic or alkaline removal solutions can be named. As the representative of the acidic resist removal solution, the removal solutions obtained by mixing alkylbenzenesulfonic acid with phenol compounds, chlorinated solvents and aromatic hydrocarbons are sold commercially and used widely but, although such conventional solutions remove resists excellently, they have the problem of generating pit-shaped corrosion caused by alkylbenzenesulfonic acid on the surface of Al-Si-Cu wiring, which is widely used in high-density integrated circuits. In addition, the fact they contain phenol compounds, which are highly toxic, and chlorinated compounds, which can cause environmental pollution, presents a problems. Also, as for alkaline resist removal solution, the removal solutions composed of organic alkali and all kinds of organic solvents are sold commercially and used widely. Since these alkaline resist removal solutions have low toxicity and little effect on environmental pollution, they have been used extensively in recent years. However, although alkaline resist removal solutions exhibit the same excellent resist removal property as the above-mentioned acidic resist removal solutions, they have the problem of pitting the surface of the Al-Si-Cu wiring material by the alkaline component. This problem remains to be solved.

In order to solve the problem of generating pitting on the surface of the Al-Si-Cu wiring material by removing the resist with an alkaline solution, it has been determined, in accordance with the invention, that the this kind of corrosion is caused by the dissociation of alkaline components mixed into the rinse solution from the alkaline resist removal solution which is mixed in during the water rinse process carried out as the last removal process.

SUMMARY OF THE INVENTION

In accordance with the invention, the use of a noncorrosive rinse solution applied to the substrate which is characterized by the fact that the solution is composed of (a) a water-soluble monovalent lower alcohol and an organic or inorganic acid, or (b) a water-soluble monovalent lower alcohol, an organic or inorganic acid and water or (c) an organic or inorganic acid and water has been found to completely prevent this kind of corrosion.

In other words, this invention provides a noncorrosive rinse solution for application to the substrate, characterized by the fact that the solution to be used as the rinse solution after removal of the resist with alkaline solution is composed of (a) a water-soluble monovalent lower alcohol and an organic or inorganic acid, or (b) a water-soluble monovalent lower alcohol, an organic or inorganic acid and water or (c) an organic or inorganic acid. Also, this invention provides a semiconductor device fabricated by a method which includes rinsing of the substrate with the rinse solution after the resist has been removed. With the use of the rinse solution of this invention, the alkaline component that is mixed into the rinse solution from the alkaline resist removal solution is neutralized, and the corrosion of Al-Si-Cu wiring is prevented completely by suppressing the dissociation of the alkaline component during water washing. Therefore, the rinse solution of this invention exhibits superior properties, thereby making the fabrication of the high-precision and high-density circuit wiring possible.

Figure 1:
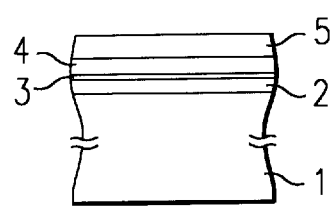
FIG. 1 is a cross-sectional view showing a model of each of the layers of a semiconductor substrate for the fabrication of of the semiconductor device.

Reference numerals as used in the drawings:

| | |
|---|---|
| 1 | Si substrate |
| 2 | CVD oxidation film |
| 3 | First metal film |
| 4 | Second metal film |
| 5 | Third metal film |
| 6 | Positive-type photoresist |
| 7 | Resist residue |

DESCRIPTION OF PREFERRED EMBODIMENTS

This invention will be explained in detail as follows:

As examples of water-soluble monovalent lower alcohols that can be used for the rinse solution of this invention, isopropyl alcohol, n-propyl alcohol, ethanol, methanol etc., can be listed. These can be used alone or as a combination of two or more kinds.

As examples of organic or inorganic acids that can be used for the rinse solution of this invention, acetic acid, sulfuric acid, oxalic acid, nitric acid, benzoic acid, dodecylbenzenesulfonic acid or their solutions can be listed. The amount of these acids used during mixing is the amount required to neutralize the alkaline component that is mixed in from the alkaline resist removal solution. If strong acids are added in excess, the acid will corrode the wiring during rinsing. Therefore, the amount added should be appropriate for the application. Also, as for the amount of water in the rinse solution, ordinarily, less than 50 wt % of the rinse solution is considered adequate. If 50 wt % or more is used, the alkaline component mixed into the rinse solution will dissociate easily, and Al-Si-Cu wiring will tend to be corroded easily in the rinse solution.

The rinse solution of this invention can be mixed with other components. As examples of such other components, a surfactant for the purpose of reducing the surface tension or preventing reattachment of the resist to the substrate etc., can be listed. Also, sugar compounds such as saccarides can be added.

Embodiments of this invention are given together with the comparative examples as follows.

Here, Table I shows the results of the microscopic evaluation of the number of pits generated by corrosion.

Embodiments and Comparative Examples

The compositions of the removal solution and the rinse solution used in the examples are shown in Table I.

A positive photoresist with a film thickness of 1.8 μm is coated after forming a two-layer TiW (bottom layer)/Al-Si-Cu (upper layer) film. The sample is then prebaked at 90° C. for 10 min in the oven. After resist patterning, postbaking is carried out at 140° C. for 30 min, and the wafer is immersed at 100° C. for 10 min in each removal solution. After removing the resist, the wafer is rinsed for 3 min in each rinse solution. It is then dried for 3 min drying after a water rinse for 3 min, and the number of pits generated by corrosion is evaluated using an optical microscope. These results are shown in Table I.

TABLE 1

| Example | Alkaline Resist Removal Solution (wt %) | Rinse Solution Component | | | No. of Corrosion Pits |
|---|---|---|---|---|---|
| | | Component Other Than Acid (wt %) | Acid | Acid (mol/L) | |
| 1. | DMSO/MEA/DMI (70/25/5) | — | Acetic Acid | | 0/mm$^2$ |
| 2. | DMSO/MEA/DMI (45/50/5) | IPA | Acetic Acid | (0.00333) | 0/mm$^2$ |
| 3. | DMSO/MEA/DMI (45/50/5) | MeOH | Acetic Acid | (0.00333) | 0/mm$^2$ |
| 4. | DMSO/MEA/DMI (45/50/5) | EtOH | Acetic Acid | (0.00333) | 0/mm$^2$ |
| 5. | DMSO/MEA/DMI (45/50/5) | IPA | Sulfuric Acid | (0.00333) | 0/mm$^2$ |
| 6. | DMSO/MEA/DMI (45/50/5) | IPA | Nitric Acid | (0.00333) | 0/mm$^2$ |
| 7. | DMSO/MEA/DMI (45/50/5) | IPA | Oxalic Acid | (0.00333) | 0/mm$^2$ |
| 8. | DMSO/MEA/DMI (45/50/5) | IPA | Benzoic Acid | (0.00333) | 0/mm$^2$ |
| 9. | DMSO/MEA/DMI (45/50/5) | IPA | Dodecylbene-zenesulfonic Acid | (0.00333) | 0/mm$^2$ |
| 10. | DMSO/MEA/DMI (45/50/5) | IPA/Water (80/20) | Acetic Acid | (0.10000) | 0/mm$^2$ |
| 11. | DMSO/MEA/DMI (45/50/5) | IPA/Water/ D-Sorbitol (50/30/20) | Acetic Acid | (0.00333) | 0/mm$^2$ |
| 12. | KP-101 Manufactured by Kanto Chemical | IPA | Acetic Acid | (0.10000) | 0/mm$^2$ |
| 13. | KP-201 Manufactured by Kanto Chemical | IPA | Acetic Acid | (0.00333) | 0/mm$^2$ |
| Comparative Example 1. | DMSO/MEA/DMI (45/50/5) | IPA | — | | 1038/mm$^2$ |
| Comparative Example 2 | DMSO/MEA/DMI (45/50/5) | MeOH | — | | 392/mm$^2$ |
| Comparative Example 3. | DMSO/MEA/DMI (45/50/5) | EtOH | — | | 161/mm$^2$ |

Note:
DMSO: Dimethyl sulfoxide
MEA: Monoethanolamine
DMI: 1,3-Dimethyl-2-imidazolidinone
IPA: Isopropyl alcohol
MeOH: Methyl alcohol
EtOH: Ethyl alcohol In the examples (Examples 1–13) in which the rinse solution of this invention was used, no corrosion of Al-Si-Cu was observed, whereas, with conventional solutions (Comparative Examples 1–3), the occurrence of corrosion was clearly recognized.

Embodiment Example 14

Figure 2:
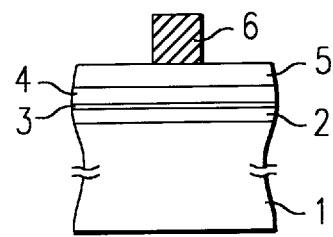
FIG. 2 is a cross-sectional view showing a model of each of the layers of the semiconductor substrate for the fabrication of the semiconductor device.
Figure 3:
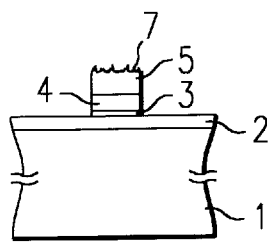
FIG. 3 is a cross-sectional view showing a model of each of the layers of the semiconductor substrate for the fabrication of the semiconductor device.
Figure 4:
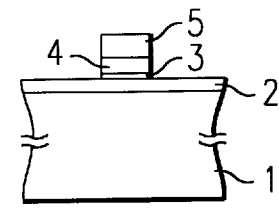
FIG. 4 is a cross-sectional view showing a model of each of the layers of the semiconductor substrate for the fabrication of the semiconductor device.

Next, a fabrication example of a semiconductor device using the rinse solution of this invention is explained, using FIGS. 1–3 as references.

First, CVD oxidation film 2, which is an insulation film, is formed on top of Si substrate 1. On top of this, TiW layer 3, which is the first metal film, CVD-W layer 4, which is the second metal film, and Al-Si-Cu layer 5, which is the third metal film, are formed in that sequence (see FIG. 1). The film thicknesses are 4,500 Å for the CVD oxidation film 2, 600 Å for the first metal film 3, 5,000 Å for the second metal film 4 and 8,000 Å for the third metal film 5. Also, Al-Si-Cu layer 5 contains 1 wt % Si and 0.5 wt % Cu.

A positive-type photoresist mask is formed by coating the surface of third metal film Al-Si-Cu layer 5 with the positive-type photoresist 6 and exposing it to the light (see FIG. 2). The main component of this positive-type photoresist is novolak resin, and its thickness is 18,000 9A. Baking is carried out at 140° C. for 30 min after the positive-type photoresist mask is formed.

Next, the region of the electroconductive layer not covered by the mask (nonmasked region) is removed by etching, and then the positive-type photoresist that has acted as a mask is removed by ashing (see FIG. 3). At that time, the residue of the resist remaining on the surface of the patterned electroconductive layer is removed using a removal solution composed of dimethyl sulfoxide:monoethanolamine:1,3-dimethyl-2-imidazolidinone=70:25:5 (wt %). The process is followed by washing with water after rinsing with a solution of isopropyl alcohol containing 0.333 mol/L acetic acid.

The rinse solution of this invention has a high cleaning power and does not corrode the Al-Si-Cu wiring material layer. As can be seen from the results shown in Table I, the number of pits generated by corrosion on the surface of the Al-Si-Cu layer clearly indicates that the rinse solution of this invention is better than the conventional solutions. Each component used in the rinse solution of this invention poses no danger to the human body from the handling standpoint and, therefore, the practical applicability is extremely high.

We claim:

1. In a method of manufacturing a semiconductor device,
    forming a conductive layer of an Al-Si-Cu alloy on a selected region of a semiconductor substrate;
    applying a photoresist material to the surface of the Al-Si-Cu conductive layer on the semiconductor substrate;
    patterning the layer of photoresist to form a photoresist mask selectively exposing regions of the Al-Si-Cu conductive layer;
    etching the exposed regions of the Al-Si-Cu conductive layer to pattern the Al-Si-Cu conductive layer as a plurality of conductive leads on the semiconductor substrate;
    removing the photoresist mask from the patterned Al-Si-Cu conductive layer by using an alkaline resist removal solution;
    rinsing the semiconductor substrate having the patterned Al-Si-Cu conductive layer thereon with a rinse solution including a non-corrosive water-soluble monovalent lower alcohol and at least one of an organic acid and an inorganic acid present in a concentration sufficient to neutralize a residual alkaline resist removal solution remaining on the semiconductor substrate and mixed into the rinse solution;
    neutralizing the residual alkaline resist removal solution in response to rinsing of the semiconductor substrate with the rinse solution having said non-corrosive water-soluble monovalent lower alcohol and at least one of an organic acid and an inorganic acid; and
    washing the semiconductor substrate with the patterned Al-Si-Cu conductive layer with water while suppressing the disassociation of the alkaline component of the residual alkaline resist removal solution in response to the neutralizing of the residual alkaline resist removal solution by said at least one of an organic acid and an inorganic acid of the rinse solution.

2. In a method of manufacturing a semiconductor device as set forth in claim 1, wherein the semiconductor substrate having the patterned Al-Si-Cu conductive layer thereon is rinsed with a rinse solution in which the non-corrosive water-soluble monovalent lower alcohol is taken from the group consisting of isopropyl alcohol, n-propyl alcohol, ethanol, and methanol; and
    said at least one of an organic acid and an inorganic acid is taken from the group consisting of acetic acid, nitric acid, sulfuric acid, oxalic acid, benzoic acid, and dodecylbenzene-sulfonic acid.

3. In a method of manufacturing a semiconductor device as set forth in claim 2, wherein the water-soluble monovalent lower alcohol is isopropyl alcohol; and
    said at least one of an organic acid and an inorganic acid is acetic acid.

4. In a method of manufacturing a semiconductor device as set forth in claim 1, wherein water is included in the rinse solution with which the semiconductor substrate having the patterned Al-Si-Cu conductive layer thereon is rinsed.

5. In a method of manufacturing a semiconductor device as set forth in claim 4, wherein the water included in the rinse solution is in an amount less than 50% by weight of the rinse solution.

6. In a method of manufacturing a semiconductor device as set forth in claim 5, wherein the semiconductor substrate having the patterned Al-Cu conductive layer thereon is rinsed with a rinse solution in which the non-corrosive water-soluble monovalent lower alcohol is taken from the group consisting of isopropyl alcohol, n-propyl alcohol, ethanol, and methanol; and
    said at least one of an organic acid and an inorganic acid is taken from the group consisting of acetic acid, nitric acid, sulfuric acid, oxalic acid, benezoic acid, and dodecylbenzene-sulfonic acid.

7. In a method of manufacturing a semiconductor device as set forth in claim 6, wherein the water-soluble monovalent lower alcohol is isopropyl alcohol; and
    said at least one of an organic acid and an inorganic acid is acetic acid.

8. In a method of manufacturing a semiconductor device as set forth in claim 7, wherein the rinse solution further includes D-sorbitol, the ratio by weight of the isopropyl alcohol, the D-sorbitol, and water being 50:20:30; and
    said acetic acid being present in a concentration of 0.00333 moles/liter.

9. A non-corrosive rinse solution for application to a semiconductor substrate during a process for making a semiconductor device after a photoresist mask applied to the semiconductor substrate has been removed by an alkaline resist removal solution, said rinse solution comprising:
    a water-soluble monovalent lower alcohol, and at least one of an organic acid and an inorganic acid;
    said at least one of an organic acid and an inorganic acid having an acid concentration just sufficient to neutralize a residual alkaline component remaining on the substrate after removal of the photoresist mask and mixed into the rinse solution;
    and further including water in an amount less than 50% by weight of the rinse solution and D-sorbitol;
    the water-soluble monovalent lower alcohol being isopropyl alcohol;
    said at least one of an organic acid and an inorganic acid being acetic acid;

the ratio by weight of the isopropyl alcohol, the D-sorbitol, and water being 50:20:30; and said acetic acid being present in a concentration of 0.00333 moles/liter.

10. In a method of manufacturing a semiconductor device, forming a conductive layer of an aluminum alloy containing at least copper on a selected region of a semiconductor substrate;

applying a photoresist material to the surface of the conductive layer of the copper-containing aluminum alloy on the semiconductor substrate;

patterning the layer of photoresist to form a photoresist mask selectively exposing regions of the conductive layer of the copper-containing aluminum alloy;

etching the exposed regions of the conductive layer of the copper-containing aluminum alloy to pattern the conductive layer as a plurality of conductive leads on the semiconductor substrate;

removing the photoresist mask from the patterned conductive layer of the copper-containing aluminum alloy by using an alkaline resist removal solution;

rinsing the semiconductor substrate having the patterned conductive layer of the copper-containing aluminum alloy thereon with a rinse solution including a non-corrosive water-soluble monovalent lower alcohol and at least one of an organic acid and an inorganic acid present in a concentration sufficient to neutralize a residual alkaline resist removal solution remaining on the semiconductor substrate and mixed into the rinse solution;

neutralizing the residual alkaline resist removal solution in response to rinsing of the semiconductor substrate with the rinse solution having said non-corrosive water-soluble monovalent lower alcohol and at least one of an organic acid and an inorganic acid; and washing the semiconductor substrate with the patterned conductive layer of the copper-containing aluminum alloy with water while suppressing the disassociation of the alkaline component of the residual alkaline resist removal solution in response to the neutralizing of the residual alkaline resist removal solution by said at least one of an organic acid and an inorganic acid of the rinse solution.

* * * * *